United States Patent [19]
Fukaishi

[11] Patent Number: 6,137,371
[45] Date of Patent: Oct. 24, 2000

[54] VOLTAGE CONTROLLED OSCILLATOR INCLUDING RING-SHAPED INVERTER CIRCUITS HAVING VOLTAGE CONTROL CIRCUITS

[75] Inventor: Muneo Fukaishi, Tokyo, Japan

[73] Assignee: NEC Corporation, Tokyo, Japan

[21] Appl. No.: 09/357,125

[22] Filed: Jul. 20, 1999

[30] Foreign Application Priority Data

Jul. 29, 1998 [JP] Japan .................................. 10-213381

[51] Int. Cl.[7] ...................................................... H03B 5/24
[52] U.S. Cl. ......................................... 331/57; 331/177 R
[58] Field of Search .............................. 331/34, 57, 111, 331/143, 175, 177 R

[56] References Cited

U.S. PATENT DOCUMENTS 5,952,892  9/1999  Szajda ........................................ 331/57

FOREIGN PATENT DOCUMENTS 61-53759  3/1986  Japan .
63-82108  4/1988  Japan .
6-291617  10/1994  Japan .

*Primary Examiner*—David Mis
*Attorney, Agent, or Firm*—McGuireWoods LLP

[57] ABSTRACT

In a voltage controlled oscillator including an odd number of inverter circuits connected in a ring shape, at least one of the inverter circuits is constructed by an inverter and a current control circuit connected in series between a pre-stage inverter circuit and post-stage inverter circuit, and a voltage control circuit connected between the pre-stage inverter circuit and the post-stage inverter circuit. The inverter receives an output signal of the pre-stage inverter circuit to generate an inverted signal. The current control circuit supplies a current in accordance with the inverted signal to the post-stage inverter circuit. The current is controlled by an input voltage. The voltage control circuit charges and discharges an input capacitance of the post-stage inverter circuit in accordance with the output signal of the pre-stage inverter circuit.

17 Claims, 8 Drawing Sheets

VOLTAGE CONTROLLED OSCILLATOR INCLUDING RING-SHAPED INVERTER CIRCUITS HAVING VOLTAGE CONTROL CIRCUITS

BACKGROUND OF THE INVENTION

1. Field of the Invention

The present invention relates to a voltage controlled oscillator used in a phase locked loop (PLL) circuit or the like.

2. Description of the Related Art

In a prior art voltage controlled oscillator including an odd number of inverter circuits connected in a ring shape (see JP-A-6-291617), at least one of the inverter circuits is constructed by an inverter and a current control circuit connected in series between a pre-stage inverter circuit and post-stage inverter circuit. The inverter receives an output signal of the pre-stage inverter circuit to generate an inverted signal. The current control circuit supplies a current in accordance with the inverted signal to the post-stage inverter circuit. This will be explained later in detail.

In the above-described prior art voltage controlled oscillator, however, since the input capacitance of the current control circuit is relatively large, the delay time for charging and discharging the above-mentioned input capacitance is relatively large, so that it is impossible to generate a high frequency output signal.

SUMMARY OF THE INVENTION

It is an object of the present invention to provide a voltage controlled oscillator having high output frequency characteristics.

According to the present invention, in a voltage controlled oscillator including an odd number of inverter circuits connected in a ring shape at least one of the inverter circuits is constructed by an inverter and a current control circuit connected in series between a pre-stage inverter circuit and post-stage inverter circuit, and is also constructed by a voltage control circuit connected between the pre-stage inverter circuit and the post-stage inverter circuit. The inverter receives an output signal of the pre-stage inverter circuit to generate an inverted signal. The current control circuit supplies a current in accordance with the inverted signal to the post-stage inverter circuit. The current is controlled by an input voltage. The voltage control circuit charges and discharges an input capacitance of the post-stage inverter circuit in accordance with the output signal of the pre-stage inverter circuit.

Thus, the delay time for charging and discharging the input capacitance of the current control circuit is compensated for by directly charging and discharging the input capacitance of the post-stage inverter circuit using the voltage control circuit.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENT

Before the description of the preferred embodiments, a prior art voltage controlled oscillator will be explained with reference to FIG. 1 (see JP-A-6-291617).

Figure 1:
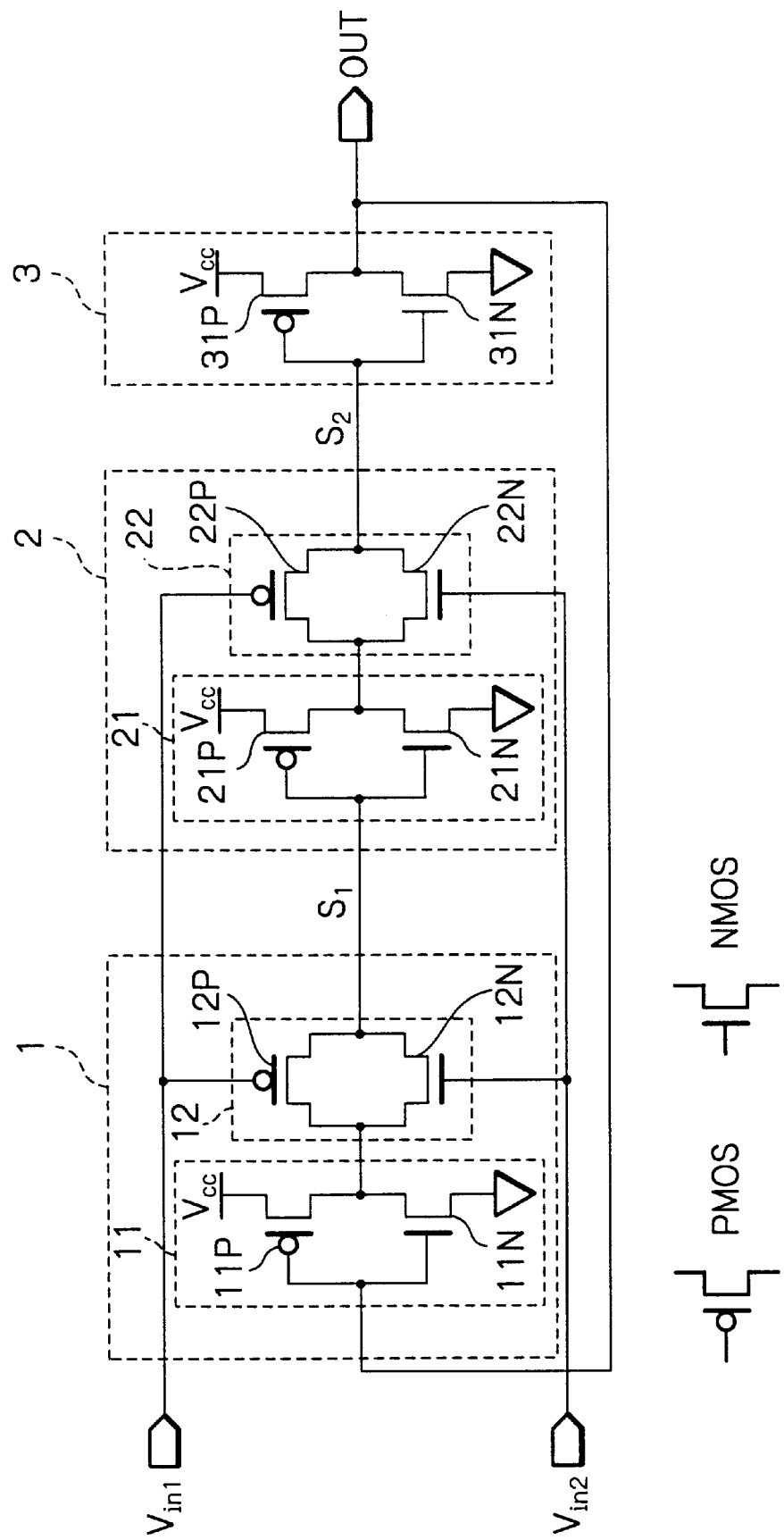
FIG. 1 is a circuit diagram illustrating a prior art voltage controlled oscillator.

In FIG. 1, three inverter circuits 1, 2 and 3 are connected in a ring shape to form a ring oscillator. In this case, the delay time of each the inverter circuits 1 and 2 can be adjusted by input voltages $V_{in1}$ and $V_{in2}$, while the delay time of the inverter 3 for outputting an output signal OUT is definite.

The inverter circuit 1 is constructed by a CMOS inverter 11 formed by a P-channel MOS transistor 11P and an N-channel MOS transistor 11N, and a current control circuit 12 formed by a P-channel MOS transistor 12P controlled by the input voltage $V_{in1}$, and an N-channel MOS transistor 12N controlled by the input voltage $V_{in2}$.

Similarly, the inverter circuit 2 is constructed by a CMOS inverter 21 formed by a P-channel MOS transistor 21P and an N-channel MOS transistor 21N, and a current control circuit 22 formed by a P-channel MOS transistor 22P controlled by the input voltage $V_{in1}$, and an N-channel MOS transistor 22N controlled by the input voltage $V_{in2}$.

Also, the inverter circuit 3 is constructed by a CMOS inverter formed by a P-channel MOS transistor 31P and an N-channel MOS transistor 31N.

The operation of the voltage controlled oscillator of FIG. 1 is explained below.

The output signal OUT is supplied to the inverter circuit 1. As a result, the inverter 11 inverts the output signal OUT to generate its inverted signal, and the inverted signal passes through the current control circuit 12 to become an output signal $S_1$. In this case, a current flowing through the current control circuit 12 depends upon the input voltages $V_{in1}$ and $V_{in2}$. Therefore, a delay time $\tau$ between the inverted signal of the inverter 11 and the output signal $S_1$ is defined by $$\tau = \tau_1 + \tau_2 \quad (1)$$

where $\tau_1$ is a time for the inverted signal of the inverter 11 to charge or discharge an input capacitance of the current control circuit 12 which is, in this case, a roughly fixed value; and $\tau_2$ is a time for the output signal $S_1$ of the current control circuit 12 to charge or discharge an input capacitance of the inverter circuit 2 and is changed in accordance with the input voltage $V_{in1}$ and $V_{in2}$. Thus, the delay time of the inverter circuit 1 is changed in accordance with the input voltages $V_{in1}$ and $V_{in2}$.

Similarly, the output signal $S_1$ of the inverter circuit 1 is supplied to the inverter circuit 2. As a result, the inverter 21 inverts the output signal $S_1$ to generate its inverted signal, and the inverted signal passes through the current control circuit 22 to become an output signal $S_2$. Also, in this case, a current flowing through the current control circuit 22 depends upon the input voltages $V_{in1}$ and $V_{in2}$. Therefore, a delay time τ between the inverted signal of the inverter 21 and the output signal $S_2$ is defined by the above mentioned equation (1). Thus, the delay time of the inverter circuit 2 is changed in accordance with the input voltages $V_{in1}$ and $V_{in2}$.

The output signal $S_2$ of the inverter circuit 2 is supplied to the inverter circuit 3, so that the output signal $S_2$ is inverted into the output signal OUT.

Figure 2:
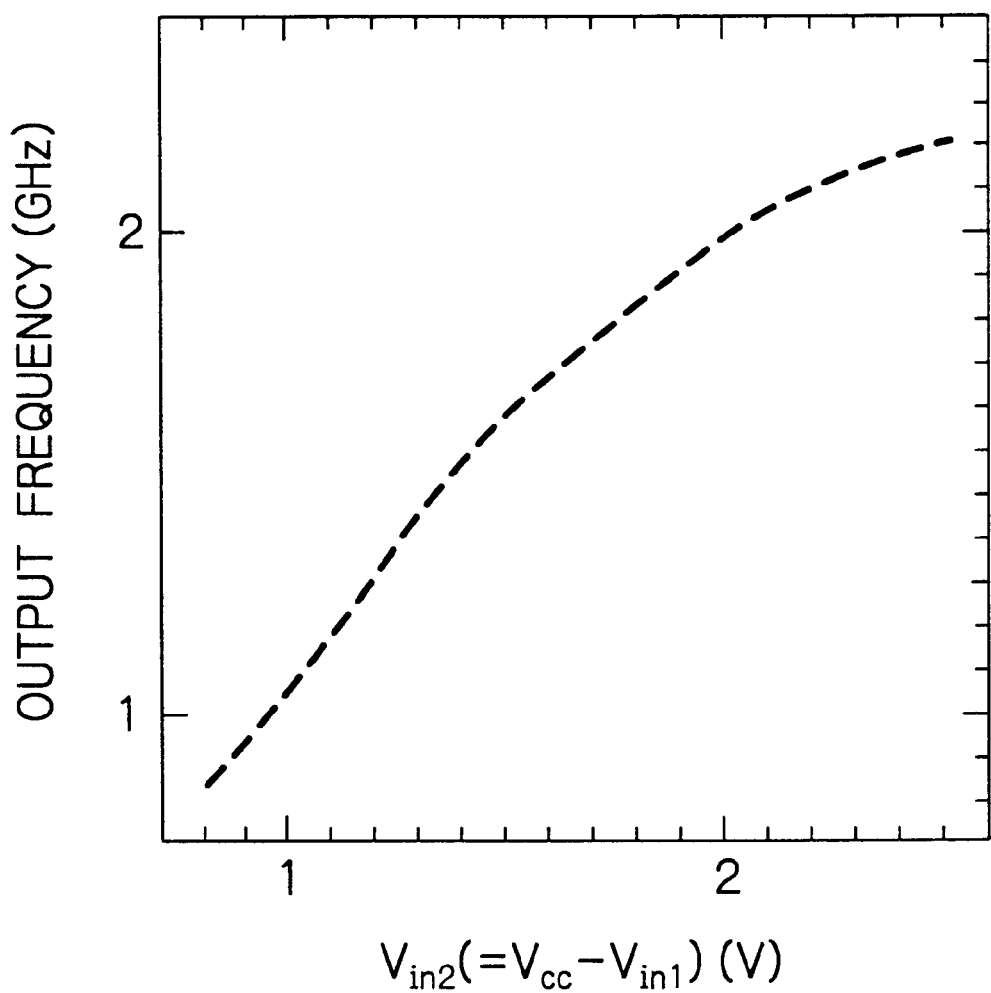
FIG. 2 is a graph showing the output frequency characteristics of the voltage controlled oscillator of FIG. 1.

In the voltage controlled oscillator of FIG. 1, however, since the input capacitance of each of the current control circuits 12 and 22 is relatively large, the time $τ_1$ is relatively large. As a result, the above-mentioned delay time τ is relatively large, it is impossible to generate a high frequency output signal OUT, as shown in FIG. 2 which shows an example of the output frequency characteristics of the voltage controlled oscillator of FIG. 1.

Figure 3:
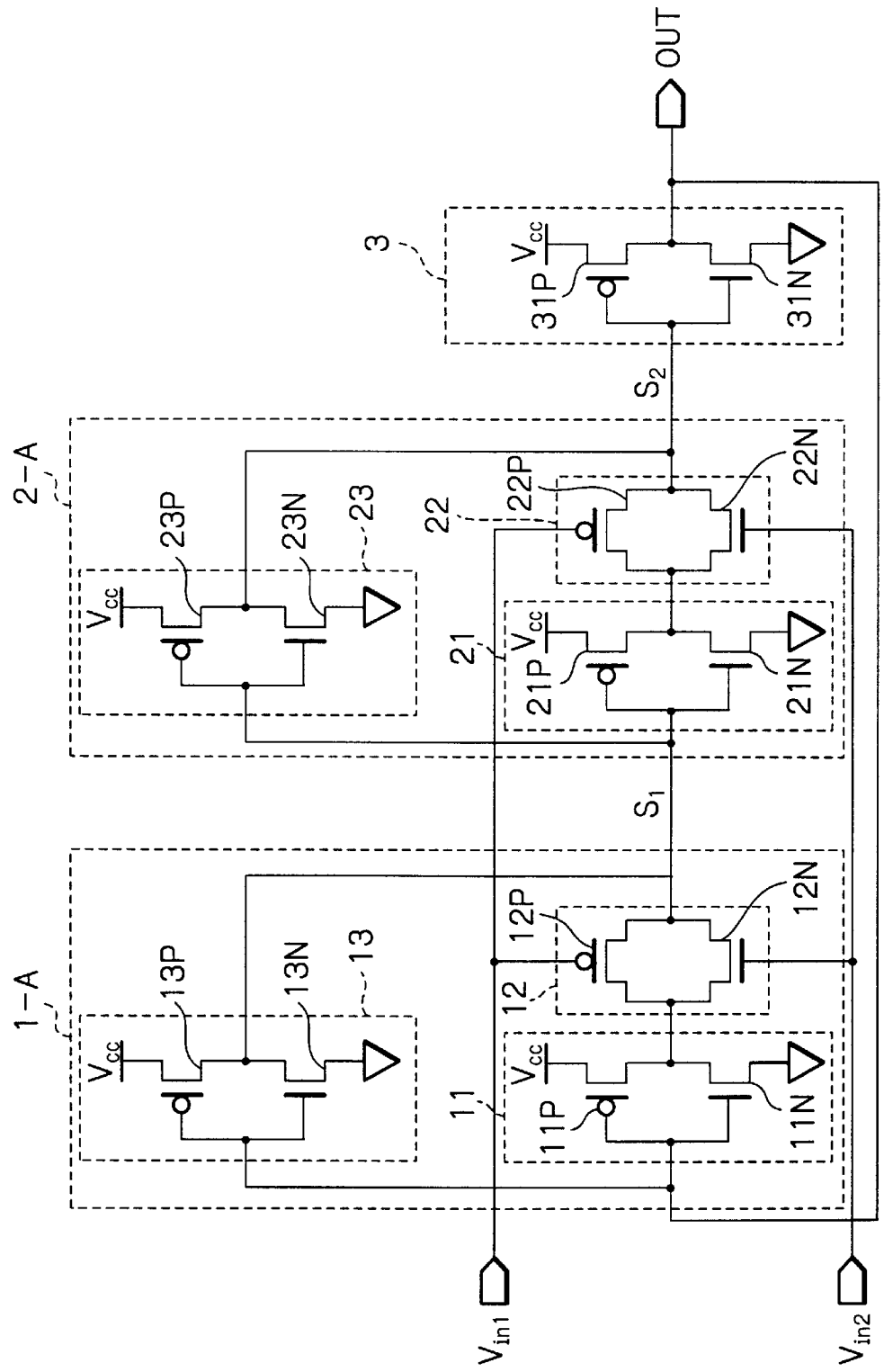
FIG. 3 is a circuit diagram illustrating a first embodiment of the voltage controlled oscillator according to the present invention.

In FIG. 3, which illustrates a first embodiment of the present invention, the inverter circuit 1 of FIG. 1 is replaced by an inverter 1-A which further includes a voltage control circuit 13 formed by a P-channel MOS transistor 13P and an N-channel MOS transistor 13N. Similarly, the inverter circuit 2 of FIG. 1 is replaced by an inverter 2-A which further includes a voltage control circuit 23 formed by a P-channel MOS transistor 23P and an N-channel MOS transistor 23N.

The voltage control circuit 13 directly charges or discharges an input capacitance of the inverter circuit 2-A, thus enhancing the change speed of the output signal $S_1$ of the inverter circuit 1-A. This is helpful for compensating for the time $τ_1$ depending on the input capacitance of the current control circuit 12. Thus, the delay time of the inverter circuit 1-A can be substantially reduced.

Similarly, the voltage control circuit 23 directly charges or discharges an input capacitance of the inverter circuit 3, thus enhancing the change speed of the output signal $S_2$ of the inverter circuit 2-A. This is helpful for compensating for the time $τ_1$ depending on the input capacitance of the current control circuit 22. Thus, the delay time of the inverter circuit 2-A can be substantially reduced.

Figure 4:
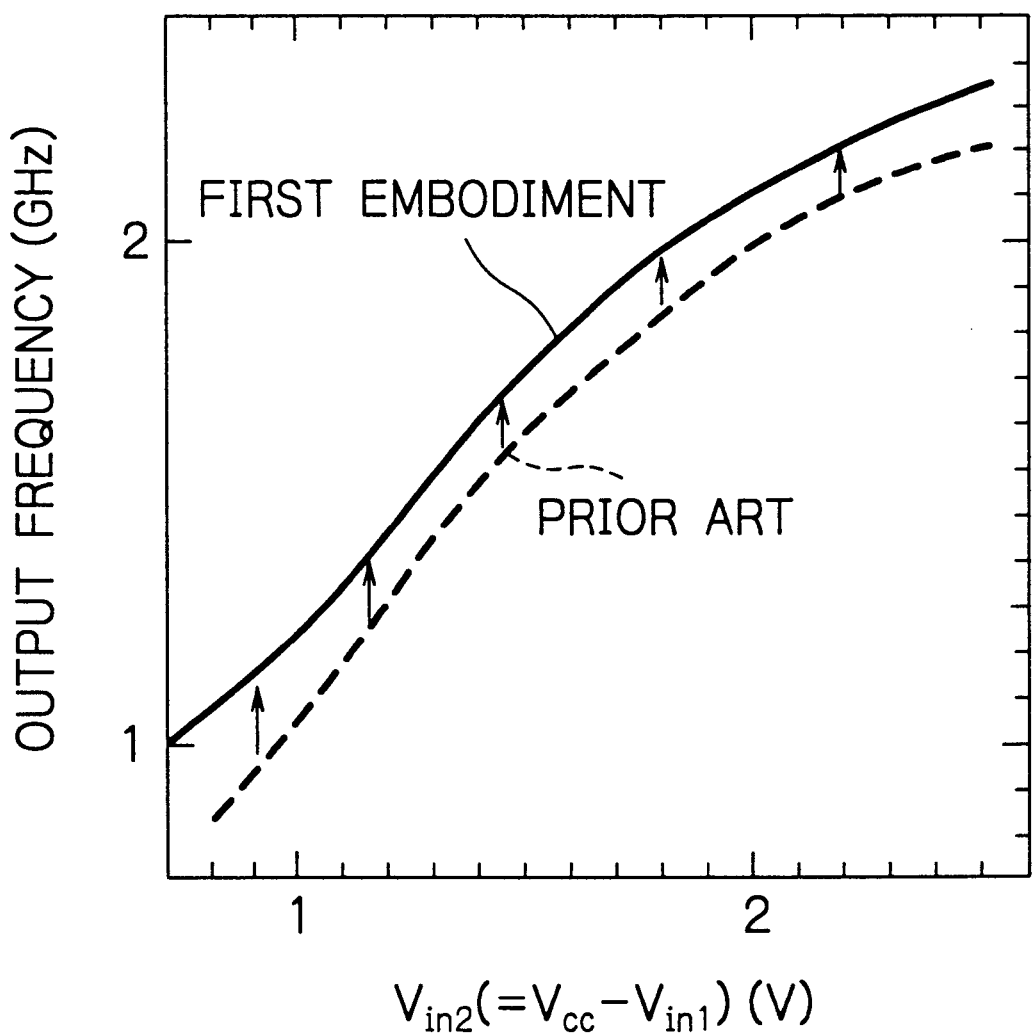
FIG. 4 is a graph showing the output frequency characteristics of the voltage controlled oscillator of FIG. 3.

In the voltage controlled oscillator of FIG. 3, the time $τ_1$ of the above-mentioned equation (1) can be neglected. As a result, the above-mentioned delay time τ is relatively small, it is possible to generate a high frequency output signal OUT, as shown in FIG. 4 which shows an example of the output frequency characteristics of the voltage controlled oscillator of FIG. 3.

Figure 5:
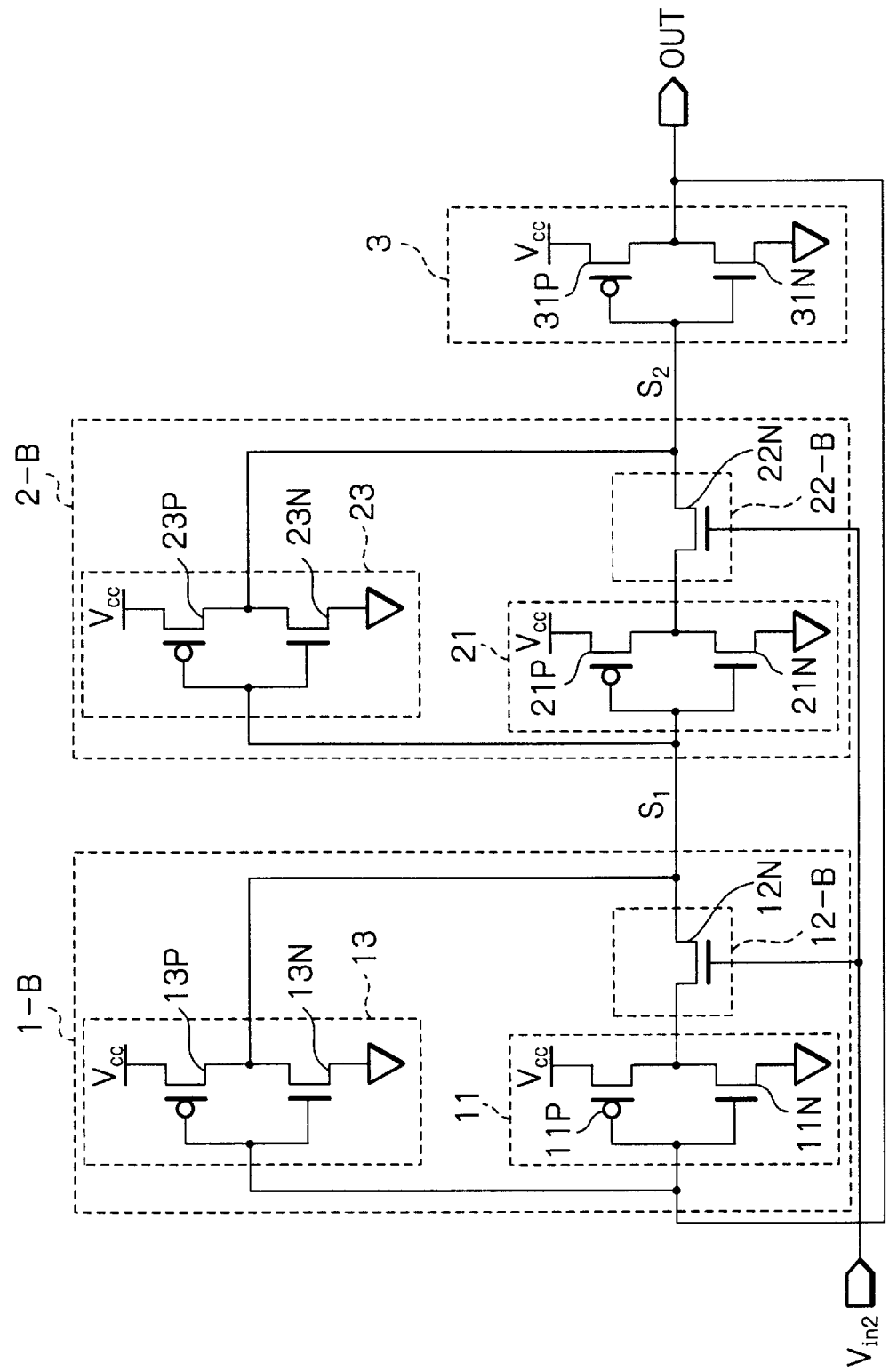
FIG. 5 is a circuit diagram illustrating a second embodiment of the voltage controlled oscillator according to the present invention.

In FIG. 5, which illustrates a second embodiment of the present invention, the inverter circuit 1-A of FIG. 3 is replaced by an inverter circuit 1-B which includes a current control circuit 12-B instead of the current control circuit 12 of FIG. 3. That is, the P-channel 12P of FIG. 3 is deleted, so that the time for charging or discharging the input capacitance of the current control circuit 12-B can be reduced. Similarly, the inverter circuit 2-A of FIG. 3 is replaced by an inverter circuit 2-B which includes a current control circuit 22-B instead of the current control circuit 22 of FIG. 3. That is, the P-channel 22P of FIG. 3 is deleted, so that the time for charging or discharging the input capacitance of the current control circuit 22-B can be reduced. Also, the application of the input voltage $V_{in1}$ is unnecessary.

In FIG. 5, even when the output voltage of the inverter 11(21) drops below $V_{in2}+V_{thn}$ where $V_{thn}$ is a threshold voltage of the transistor 12N (22N), the N-channel MOS transistor 13N (23N) can pull down the output signal $S_1$ ($S_2$) to ground.

Figure 6:
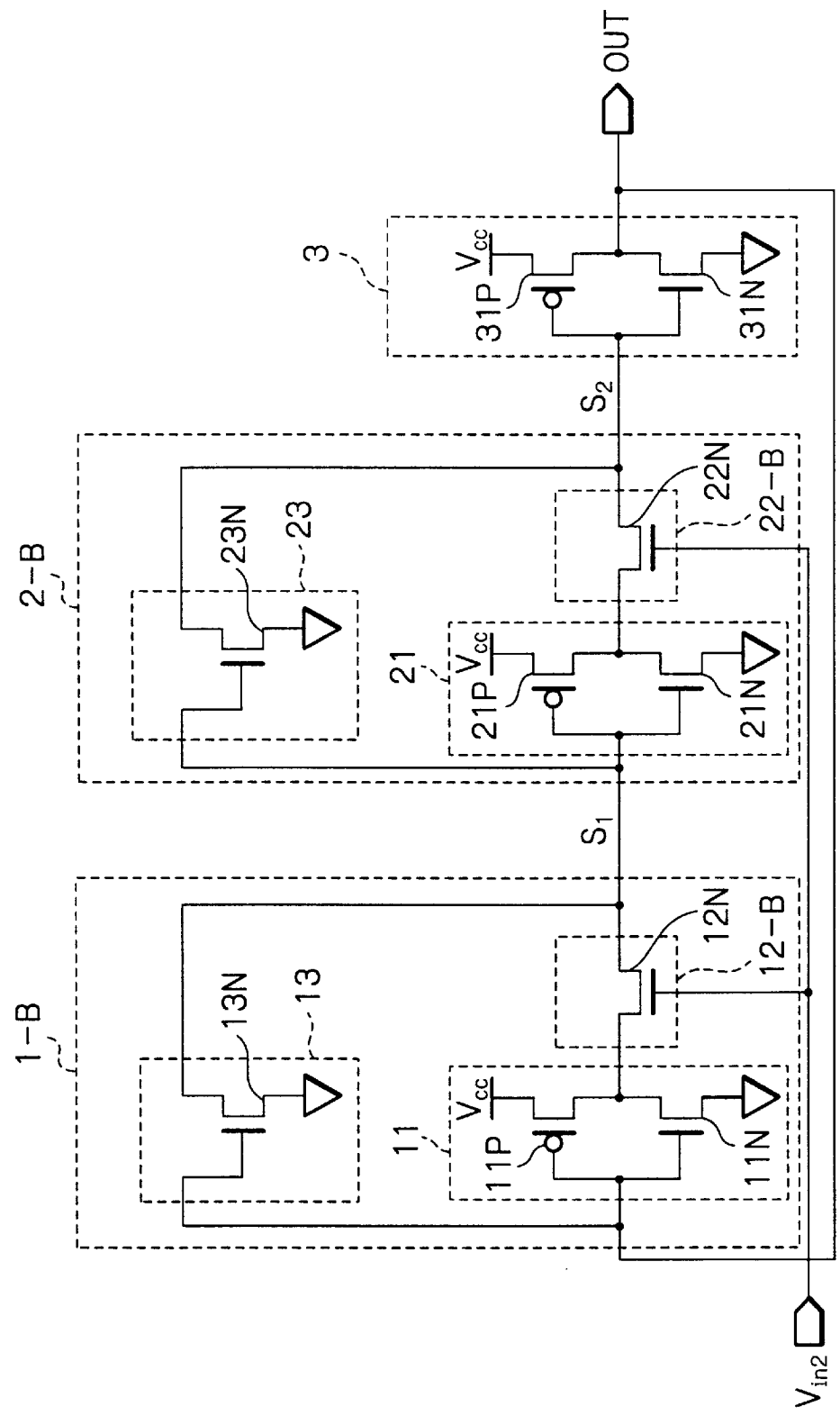
FIG. 6 is a circuit diagram illustrating a modification of the voltage oscillator of FIG. 5.

In FIG. 6, which illustrates a modification of the voltage controlled oscillator of FIG. 5, the P-channel MOS transistor 13P (23P) of the voltage control circuit 13 (23) is deleted from FIG. 5. In this case, a similar effect in the voltage controlled oscillator of FIG. 5 can be expected.

Figure 7:
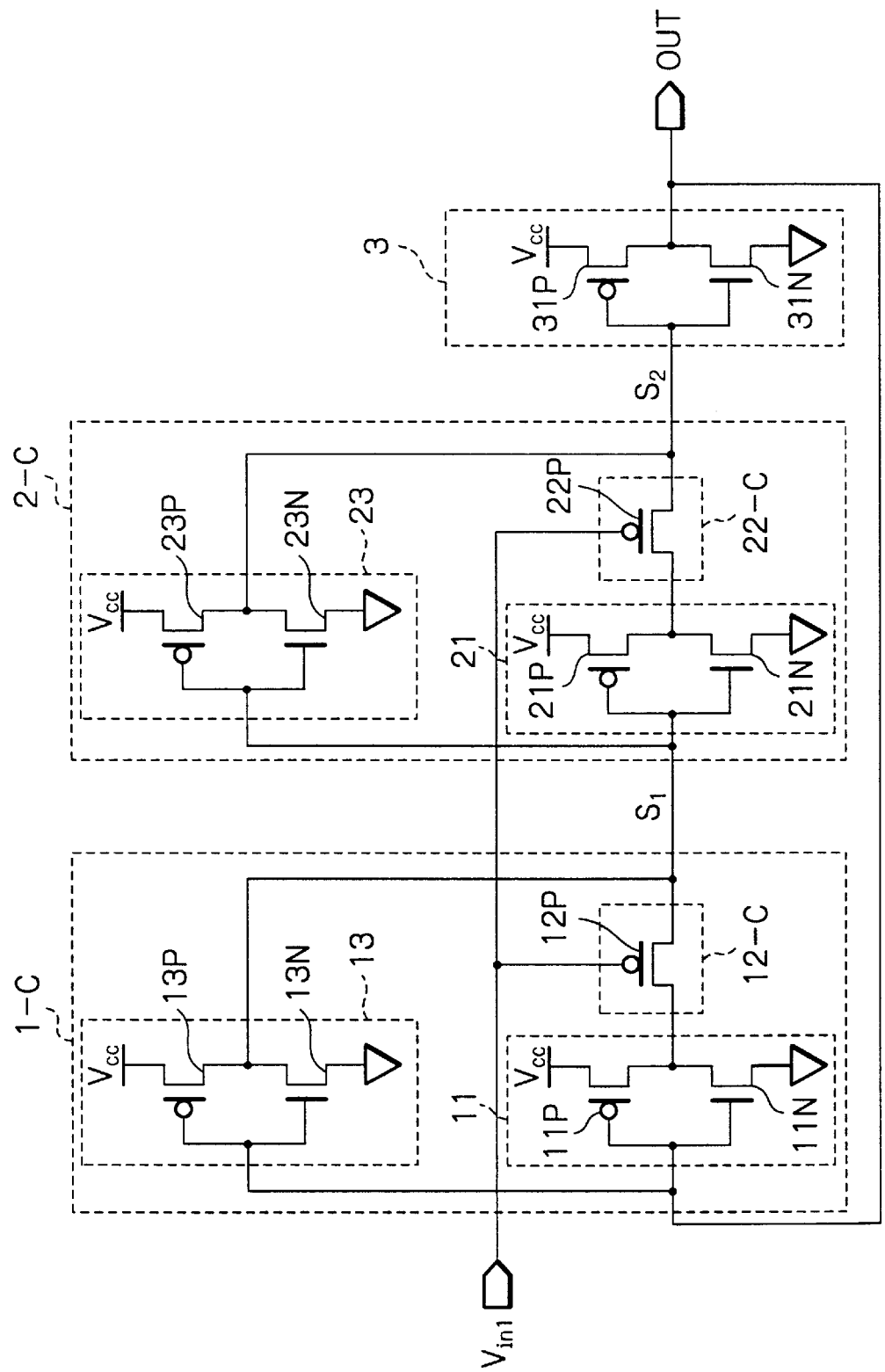
FIG. 7 is a circuit diagram illustrating a third embodiment of the voltage controlled oscillator according to the present invention.

In FIG. 7, which illustrates a third embodiment of the present invention, the inverter circuit 1-A of FIG. 3 is replaced by an inverter circuit 1-C which includes a current control circuit 12-C instead of the current control circuit 12 of FIG. 3. That is, the N-channel 12N of FIG. 3 is deleted, so that the time for charging or discharging the input capacitance of the current control circuit 12-C can be reduced. Similarly, the inverter circuit 2-A of FIG. 3 is replaced by an inverter circuit 2-C which includes a current control circuit 22-C instead of the current control circuit 22 of FIG. 3. That is, the N-channel 22N of FIG. 3 is deleted, so that the time for charging or discharging the input capacitance of the current control circuit 22-C can be reduced. Also, the application of the input voltage $V_{in2}$ is unnecessary.

In FIG. 7, even when the output voltage of the inverter 11(21) drops below $V_{in1}+V_{thp}$ where $V_{thp}$ is a threshold voltage of the transistor 12P (22P), the P-channel MOS transistor 13P (23P) can pull up the output signal $S_1$ ($S_2$) to $V_{CC}$.

Figure 8:
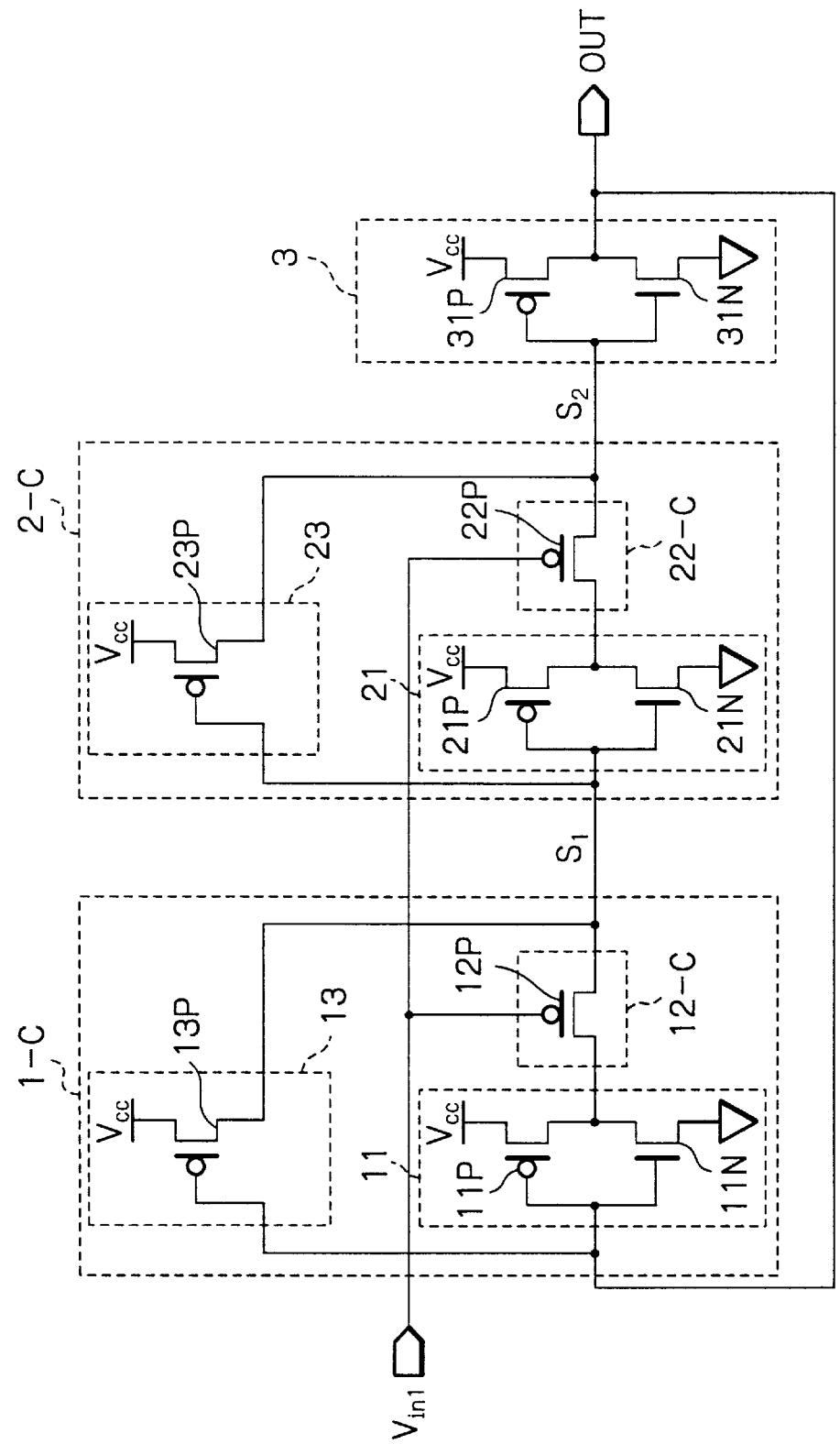
FIG. 8 is a circuit diagram illustrating a modification of the voltage oscillator of FIG. 7.

In FIG. 8, which illustrates a modification of the voltage controlled oscillator of FIG. 7, the N-channel MOS transistor 13N (23N) of the voltage control circuit 13 (23) is deleted from FIG. 7. In this case, a similar effect in the voltage controlled oscillator of FIG. 7 can be expected.

In the above-described embodiments, although three inverter circuits are connected in a ring shape, the present invention can also be applied to a voltage controlled oscillator where an odd number of inverter circuits such as five inverter circuits, seven inverter circuits, . . . are connected in a ring shape. Also, note that each of the inverter circuits does not need to include one current control circuit and one voltage control circuits; in the present invention, at least one of the inverter circuits includes one current control circuit and one voltage control circuit.

As explained hereinabove, according to the present invention, since the delay time of at least one inverter circuit is reduced by incorporating a voltage control circuit thereinto, the oscillation frequency can be increased.

What is claimed is:

1. A voltage controlled oscillator including an odd number of inverter circuits connected in a ring shape, at least one of said inverter circuits comprising:

an inverter, connected to a pre-stage one of said inverter circuits at a pre-stage of said at least one of said inverter circuits, for receiving an output signal of said pre-stage inverter circuit to generate an inverted signal;

a current control circuit, connected to said inverter, for supplying a current in accordance with the inverted signal to a post-stage one of said inverter circuits at a post-stage of said at least one of said inverter circuits, said current being controlled by an input voltage; and a voltage control circuit, connected between said pre-stage inverter circuit and said post-stage inverter circuit, for charging and discharging an input capacitance of said post-stage inverter circuit in accordance with the output signal of said pre-stage inverter circuit.

2. The voltage controlled oscillator as set forth in claim 1, wherein said inverter comprises:

a P-channel MOS transistor connected between a high power supply terminal and an output terminal and having a gate whose voltage is controlled by the output signal of said pre-stage inverter circuit; and an N-channel MOS transistor connected between said output terminal and a low power supply terminal and having a gate whose voltage is controlled by the output signal of said pre-stage inverter circuit.

3. The voltage controlled oscillator as set forth in claim 1, wherein said current control circuit comprises a P-channel MOS transistor connected between said inverter and said post-stage inverter circuit and having a gate whose voltage is controlled by said input voltage.

4. The voltage controlled oscillator as set forth in claim 1, wherein said current control circuit comprises an N-channel MOS transistor connected between said inverter and said post-stage inverter circuit and having a gate whose voltage is controlled by said input voltage.

5. The voltage controlled oscillator as set forth in claim 1, wherein said voltage control circuit comprises:
   a P-channel MOS transistor connected between a high power supply terminal and said post-stage inverter circuit and having a gate whose voltage is controlled by the output signal of said pre-stage inverter circuit; and
   an N-channel MOS transistor connected between said post-stage inverter circuit and a low power supply terminal and having a gate whose voltage is controlled by the output signal of said pre-stage inverter circuit.

6. The voltage controlled oscillator as set forth in claim 1, wherein said voltage control circuit comprises a P-channel MOS transistor connected between a high power supply terminal and said post-stage inverter circuit and having a gate whose voltage is controlled by the output signal of said pre-stage inverter circuit.

7. The voltage controlled oscillator as set forth in claim 1, wherein said voltage control circuit comprises an N-channel MOS transistor connected between said post-stage inverter circuit and a low power supply terminal and having a gate whose voltage is controlled by the output signal of said pre-stage inverter circuit.

8. A voltage controlled oscillator including an odd number of inverter circuits connected in a ring shape, at least one of said inverter circuits comprising:
   an inverter, connected to a pre-stage one of said inverter circuits at a pre-stage of said at least one of said inverter circuits, for receiving an output signal of said pre-stage inverter circuit to generate an inverted signal;
   a current control circuit, connected to said inverter, for supplying a current in accordance with the inverted signal to a post-stage one of said inverter circuits at a post-stage of said at least one of said inverter circuits, said current being controlled by first and second input voltages; and
   a voltage control circuit, connected between said pre-stage inverter circuit and said post-stage inverter circuit, for charging and discharging an input capacitance of said post-stage inverter circuit in accordance with the output signal of said pre-stage inverter circuit.

9. The voltage controlled oscillator as set forth in claim 8, wherein said inverter comprises:
   a P-channel MOS transistor connected between a high power supply terminal and an output terminal and having a gate whose voltage is controlled by the output signal of said pre-stage inverter circuit; and
   an N-channel MOS transistor connected between said output terminal and a low power supply terminal and having a gate whose voltage is controlled by the output signal of said pre-stage inverter circuit.

10. The voltage controlled oscillator as set forth in claim 8, wherein said current control circuit comprises:
   a P-channel MOS transistor connected between said inverter and said post-stage inverter circuit and having a gate whose voltage is controlled by said first input voltage; and
   an N-channel MOS transistor connected between said inverter and said post-stage inverter circuit and having a gate whose voltage is controlled by said second input voltage.

11. The voltage controlled oscillator as set forth in claim 8, wherein said voltage control circuit comprises:
   a P-channel MOS transistor connected between a high power supply terminal and said post-stage inverter circuit and having a gate whose voltage is controlled by the output signal of said pre-stage inverter circuit; and
   an N-channel MOS transistor connected between said post-stage inverter circuit and a low power supply terminal and having a gate whose voltage is controlled by the output signal of said pre-stage inverter circuit.

12. The voltage controlled oscillator as set forth in claim 8, wherein said voltage control circuit comprises a P-channel MOS transistor connected between a high power supply terminal and said post-stage inverter circuit and having a gate whose voltage is controlled by the output signal of said pre-stage inverter circuit.

13. The voltage controlled oscillator as set forth in claim 8, wherein said voltage control circuit comprises an N-channel MOS transistor connected between said post-stage inverter circuit and a low power supply terminal and having a gate whose voltage is controlled by the output signal of said pre-stage inverter circuit.

14. A voltage controlled oscillator including an odd number of inverter circuits connected in a ring shape, at least one of said inverter circuits comprising:
   an inverter, connected to a pre-stage one of said inverter circuits at a pre-stage of said at least one of said inverter circuits, for receiving an output signal of said pre-stage inverter circuit to generate an inverted signal;
   a first N-channel MOS transistor connected between said inverter and a post-stage one of said inverter circuits at a post-stage of said at least one of said inverter circuits, and having a gate whose voltage being controlled by an input voltage; and
   a second N-channel MOS transistor, connected between said pre-stage inverter circuit and said post-stage inverter circuit, and a low power supply terminal and having a gate whose voltage is controlled by the output signal of said pre-stage inverter circuit.

15. The voltage controlled oscillator as set forth in claim 14, wherein said inverter comprises:
   a P-channel MOS transistor connected between a high power supply terminal and an output terminal and having a gate whose voltage is controlled by the output signal of said pre-stage inverter circuit; and
   a third N-channel MOS transistor connected between said output terminal and a low power supply terminal and having a gate whose voltage is controlled by the output signal of said pre-stage inverter circuit.

16. A voltage controlled oscillator including an odd number of inverter circuits connected in a ring shape, at least one of said inverter circuits comprising:
   an inverter, connected to a pre-stage one of said inverter circuits at a pre-stage of said at least one of said inverter circuits, for receiving an output signal of said pre-stage inverter circuit to generate an inverted signal;
   a first P-channel MOS transistor connected between said inverter and a post-stage one of said inverter circuits at a post-stage of said at least one of said inverter circuits, and having a gate whose voltage being controlled by an input voltage; and a second P-channel MOS transistor, connected between said pre-stage inverter circuit and said post-stage inverter circuit, and a high power supply terminal and having a gate whose voltage is controlled by the output signal of said pre-stage inverter circuit.

17. The voltage controlled oscillator as set forth in claim 16, wherein said inverter comprises:

a third P-channel MOS transistor connected between a high power supply terminal and an output terminal and having a gate whose voltage is controlled by the output signal of said pre-stage inverter circuit; and an N-channel MOS transistor connected between said output terminal and a low power supply terminal and having a gate whose voltage is controlled by the output signal of said pre-stage inverter circuit.

* * * * *